(12) United States Patent
Jang et al.

(10) Patent No.: US 11,908,755 B2
(45) Date of Patent: Feb. 20, 2024

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Sang Jae Jang, Seoul (KR); Weilung Lu, Chandler, AZ (US); Burt Barber, Phoenix, AZ (US); Adrian Arcedera, Chandler, AZ (US); Shingo Nakamura, Kanagawa (JP)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 219 days.

(21) Appl. No.: 16/797,307

(22) Filed: Feb. 21, 2020

(65) Prior Publication Data

US 2021/0265225 A1   Aug. 26, 2021

(51) Int. Cl.
*H01L 23/043* (2006.01)
*H01L 21/52* (2006.01)
*H01L 23/06* (2006.01)
*H01L 23/31* (2006.01)
*H01L 21/50* (2006.01)
(Continued)

(52) U.S. Cl.
CPC ............ *H01L 23/043* (2013.01); *H01L 21/50* (2013.01); *H01L 21/52* (2013.01); *H01L 23/04* (2013.01); *H01L 23/055* (2013.01); *H01L 23/06* (2013.01); *H01L 23/10* (2013.01); *H01L 23/16* (2013.01); *H01L 23/3128* (2013.01); *H01L 23/3135* (2013.01); *H01L 23/3157* (2013.01); *H01L 23/49838* (2013.01)

(58) Field of Classification Search
CPC ....... H01L 23/043; H01L 23/06; H01L 21/52; H01L 23/10; H01L 23/16; H01L 23/3128; H01L 23/3135; H01L 23/055; H01L 23/49838; H01L 21/50; H01L 21/56; H01L 23/04; H01L 23/3157; H01L 2224/32225; H01L 2224/48091; H01L 2224/48227; H01L 2224/73265; H01L 2224/8592; H01L 2924/15311; H01L 2924/16235
See application file for complete search history.

(56) References Cited

U.S. PATENT DOCUMENTS 8,008,762 B2 * 8/2011 Bolken .................. H01L 24/97
257/434
9,952,110 B2   4/2018 Beer et al.
(Continued)

FOREIGN PATENT DOCUMENTS

EP            3267486 A1 * 1/2018 ....... H01L 27/14618

*Primary Examiner* — Ermias T Woldegeorgis
(74) *Attorney, Agent, or Firm* — Spectrum IP Law Group LLC

(57) ABSTRACT

In one example, a semiconductor device comprises a substrate comprising a top side, a bottom side, and a conductive structure, a body over the top side of the substrate, an electronic component over the top side of the substrate and adjacent to the body, wherein the electronic component comprises an interface element on a top side of the electronic component, a lid over the interface element and a seal between the top side of the electronic component and the lid, and a buffer on the top side of the substrate between the electronic component and the body. Other examples and related methods are also disclosed herein.

18 Claims, 16 Drawing Sheets

(51) Int. Cl.
*H01L 23/04* (2006.01)
*H01L 23/10* (2006.01)
*H01L 23/16* (2006.01)
*H01L 23/055* (2006.01)
*H01L 23/498* (2006.01)

(56) References Cited

U.S. PATENT DOCUMENTS

| | | | |
|---|---|---|---|
| 2004/0075761 A1* | 4/2004 | Maeda | H01L 31/0203 |
| | | | 348/340 |
| 2006/0023108 A1* | 2/2006 | Watanabe | H01L 27/14627 |
| | | | 348/335 |
| 2008/0083964 A1* | 4/2008 | Fujimoto | H01L 27/14618 |
| | | | 257/E31.127 |
| 2019/0019834 A1* | 1/2019 | Tu | H01L 24/49 |

* cited by examiner

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
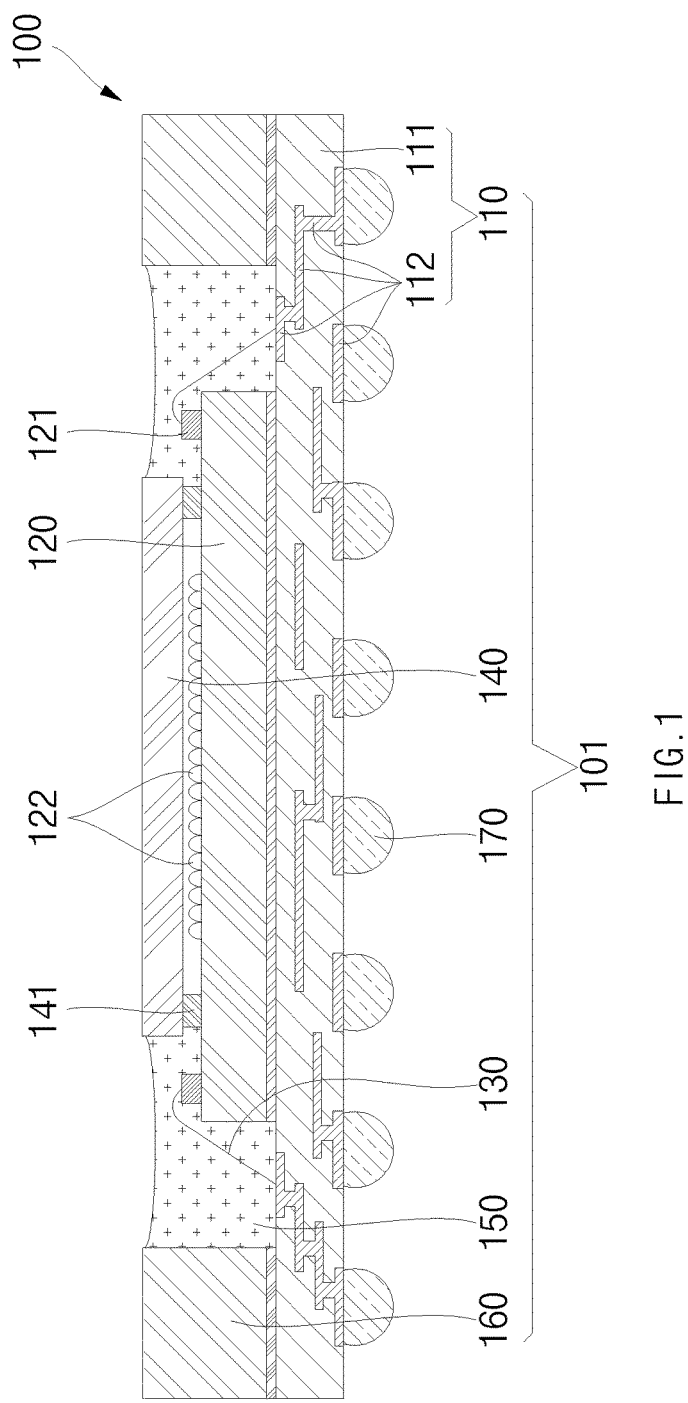
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a substrate comprising a top side, a bottom side, and a conductive structure, a body over the top side of the substrate, an electronic component over the top side of the substrate and adjacent to the body, wherein the electronic component comprises an interface element on a top side of the electronic component, a lid over the interface element and a seal between the top side of the electronic component and the lid, and a buffer on the top side of the substrate between the electronic component and the body.

In another example, a method comprises providing a substrate comprising a top side, a bottom side, and a conductive structure, providing an electronic component over the top side of the substrate, wherein the electronic component comprises an interface element and a component terminal on the top side of the electronic component, providing an internal interconnect electrically coupling the interface element and the conductive structure, providing a lid over the interface element and seal between the top side of the electronic component and the lid, and providing a body over the top side of the substrate.

In a further example, a semiconductor device comprises a substrate comprising a top side, a bottom side, and a conductive structure, an electronic component over the top side of the substrate, wherein the electronic component comprises an interface element and a component terminal on a top side of the electronic component, an internal interconnect electrically coupled to the component terminal and the conductive structure, a lid over the interface element, a seal between the top side of the electronic component and the lid, and a body over the top side of the substrate.

Other examples are included in the present disclosure. Such examples may be found in the figures, in the claims, or in the description of the present disclosure.

FIG. 1 shows a cross-sectional view of an example semiconductor device 100. In the example shown in FIG. 1, semiconductor device 100 can comprise substrate 110, electronic component 120, internal interconnects 130, lid 140, body 160, buffer 150, and external interconnects 170.

Substrate 110 can comprise dielectric structure 111 and conductive structure 112. Electronic component 120 can comprise component terminals 121 and one or more interface elements 122. In some examples, substrate 110 can comprise a top side 110a and a bottom side 110b, and body 160 can be over the top side 110a of the substrate 110. Electronic component 120 can be over the top side 110a of the substrate 110 and can be adjacent to body 160.

Substrate 110, internal interconnects 130, lid 140, body 160, buffer 150, and external interconnects 170 can be referred to as semiconductor package 101 or package 101, and semiconductor package 101 can provide protection for electronic component 120 from external elements or environmental exposure. Semiconductor package 101 can provide electrical coupling between an external component and electronic component 120. In some examples, electronic component 120 can have interface elements 122 on a top side 120a of electronic component 120, and lid 140 can be over interface elements 122. In some examples, lid 140 can be sealed over the top side 120a of electronic component 120 with a seal 141, and a buffer 150 can be on the top side 110a of substrate 110 between electronic component 120 and body 160.

Figure 2A:
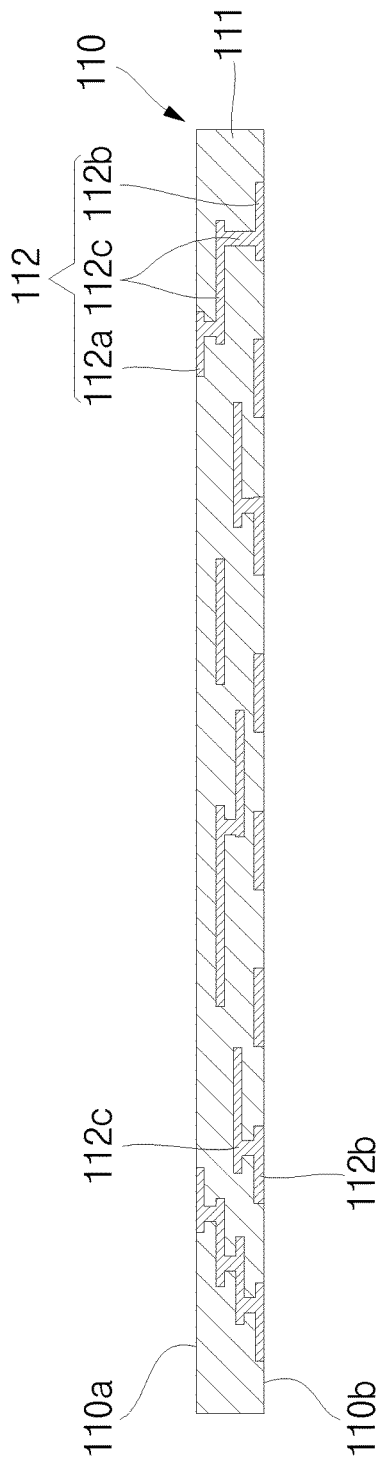
FIGS. 2A to 2G show cross-sectional views of an example method for manufacturing an example semiconductor device.

FIGS. 2A to 2G show cross-sectional views of an example method for manufacturing an example semiconductor device 100. FIG. 2A shows a cross-sectional view of semiconductor device 100 at an early stage of manufacture. In the example shown in FIG. 2A, substrate 110 can be provided and can comprise dielectric structure 111 and conductive structure 112.

In some examples, dielectric structure 111 can have substantially planar top and bottom sides that can be exposed at top side 110a or bottom side 110b of substrate 110, respectively. In some examples, dielectric structure 111 can comprise or be referred to as one or more dielectric layers. In some examples, such one or more dielectric layers can comprise a core layer. In some examples, dielectric structure 111 can comprise epoxy resin, phenol resin, glass epoxy, polyimide, polyester, epoxy molding compound, or ceramic. In some examples, dielectric structure 111 can have a thickness in the range from approximately 0.1 millimeters (mm) to approximately 0.5 mm. In some examples, a rigidity of dielectric structure 111 can be sufficient to allow substrate 110 to be maintained at a substantially planar state without fracturing.

Conductive structure 112 can comprise substrate top terminals 112a exposed at top side 110a of dielectric structure 111, substrate bottom terminals 112b exposed at bottom side 110b of dielectric structure 111, and conductive path 112c located within dielectric structure 111. Substrate top terminals 112a and substrate bottom terminals 112b can be exposed through top side 110a and bottom side 110b of dielectric structure 111 in a matrix configuration having rows or columns. In some examples, substrate top terminals 112a and substrate bottom terminals 112b can comprise or be referred to as conductors, conductive substrate lands, conductive lands, substrate pads, wiring pads, connection pads, micro pads, or under-bump-metallurgies (UBMs). Conductive paths 112c can be located within dielectric structure 111 to electrically connect substrate top terminals 112a with substrate bottom terminals 112b. Conductive paths 112c can comprise one or more conductive layers. In some examples, conductive paths 112c can comprise or be referred to as conductors, conductive materials, conductive vias, circuit patterns, traces, or wiring patterns. In some examples, substrate top terminals 112a, substrate bottom terminals 112b or conductive paths 112c can comprise copper, iron, nickel, gold, silver, palladium, or tin.

In some examples, substrate 110 can comprise or be referred to as a printed circuit board, a laminate substrate, a cavity substrate, a multi-layered substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate or a pre-molded lead frame.

In some examples, substrate 110 can comprise a redistribution layer ("RDL"). RDL substrates can comprise one or more conductive redistribution layers and one or more dielectric layers that (a) can be provided layer by layer over an electronic device to which the RDL substrate is to be electrically coupled, or (b) can be provided layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be provided in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be provided using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to provide a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of one or more inorganic dielectric layers can comprise silicon nitride (Si3N4), silicon oxide (SiO2), or silicon oxynitride (SiON). The one or more inorganic dielectric layers can be provided by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Other substrates in this disclosure can also comprise an RDL substrate.

In some examples, substrate 110 can comprise a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be provided by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be provided on the permanent core structure. In some examples, the pre-formed substrate can be a coreless substrate omitting the permanent core structure, and the dielectric and conductive layers can be provided on a sacrificial carrier and can be removed after formation of the dielectric and conductive layers and before attachment to the electronic device. The pre-formed substrate can rereferred to as a printed circuit board (PCB) or a laminate substrate. Such pre-formed substrate can be provided through a semi-additive or modified-semi-additive process. Other substrates in this disclosure can also comprise a pre-formed substrate.

Figure 2B:
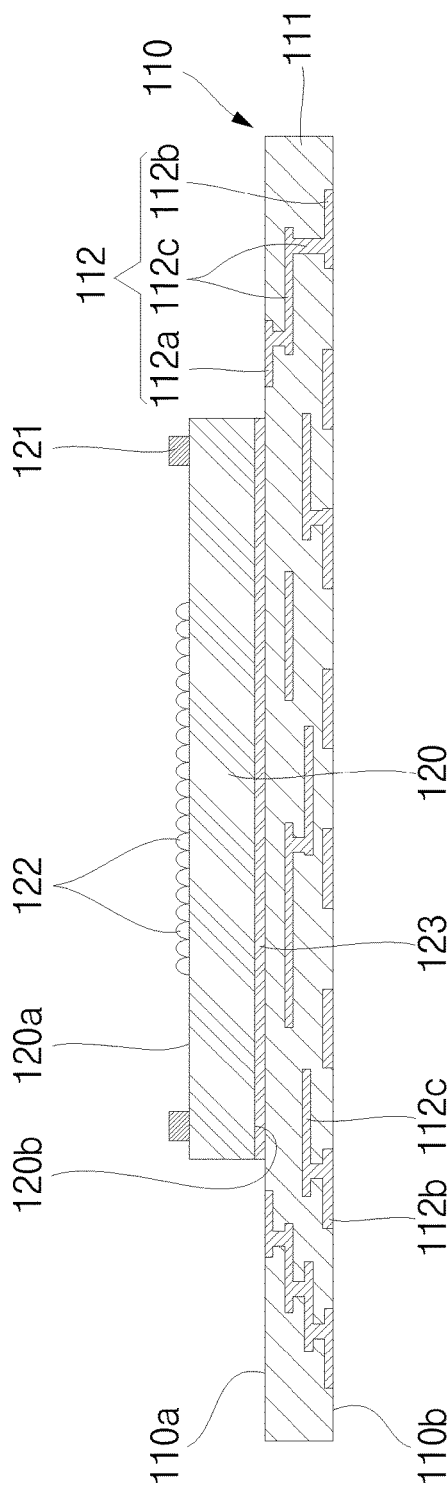

FIG. 2B shows a cross-sectional view of semiconductor device 100 at a later stage of manufacture. Electronic component 120 can be provided comprising one or more interface elements 122 and a component terminal 121 on a top side 120a of electronic component 120. In the example shown in FIG. 2B, bottom side 120b of electronic component 120 can be attached to or can be over top side 110a of substrate 110 using component adhesive 123. In some examples, component adhesive 123 can be coated or adhered on dielectric structure 111 on top side 110a of substrate 110, and pick-and-place equipment can pick up electronic component 120 to place it on component adhesive 123 to attach electronic component 120 to substrate 110. Electronic component 120 can comprise or be referred to as a die, a chip, or a packaged semiconductor device. The overall thickness of electronic component 120 can be in the range from approximately 50 micrometers ($\mu m$) to approximately 800 $\mu m$.

Electronic component 120 can comprise an active region and a non-active region. In some examples, the active region can be at top side 120a of electronic component 120, opposite to substrate 110, and the non-active region can be at bottom side 120b and adhered to substrate 110. The active region can comprise one or more component terminals 121 or interface elements 122.

Component terminals 121 can comprise one or more component terminals arranged on top side 120a of electronic component 120. In some examples, component terminals 121 can be spaced apart from each other in row or column directions along the periphery of top side 120a. In some examples, component terminals 121 can comprise or be referred to as die pads, bond pads, or bumps. In some examples, component terminals 121 can comprise an electrically conductive material such as a metallic material, aluminum, copper, an aluminum alloy, or a copper alloy. Component terminals 121 can be signal input/output terminals of electronic component 120. In some examples, component terminals 121 can have a thickness in the range from approximately 5 $\mu m$ to approximately 20 $\mu m$.

Interface elements 122 can be electrically connected to component terminals 121 by circuitry provided at top side 120a or at the active region of electronic component 120. In some examples, interface elements 122 can be located substantially at the center of top side 120a of electronic component 120. In some examples, interface elements 122 can comprise or be referred to as sensors, Micro-Electro Mechanical Systems (MEMS) elements, fingerprint sensors, light sensors, light transmitters or receivers, whether visible or invisible light or radiation, wireless or radio-frequency (RF) transmitters or receivers such as antenna elements, sonic transmitters or receivers such as ultrasound, or receiver/transmitter elements. In some examples, interface elements 122 can have a thickness in the range from approximately 1 $\mu m$ to approximately 10 $\mu m$.

Component adhesive 123 can attach bottom side 120b of electronic component 120 to top side 110a of substrate 110. Component adhesive 123 can be positioned between bottom side 120b of electronic component 120 and top side 110a of substrate 110. In some examples, component adhesive 123 can be provided on the side of substrate 110 using a coating process such as spin coating, painting, spray coating, or curtain coating, a printing process such as screen printing, pad printing, gravure printing, flexographic coating, or offset printing, an inkjet printing process with features intermediate between coating and printing, or direct attachment of an adhesive film or an adhesive tape. In some examples, component adhesive 123 can comprise or be referred to as an adhesive layer or an adhesive film such as a die-attach film. Component adhesive 123 can have a thickness in the range from approximately 5 $\mu m$ to approximately 60 $\mu m$.

Figure 2C:
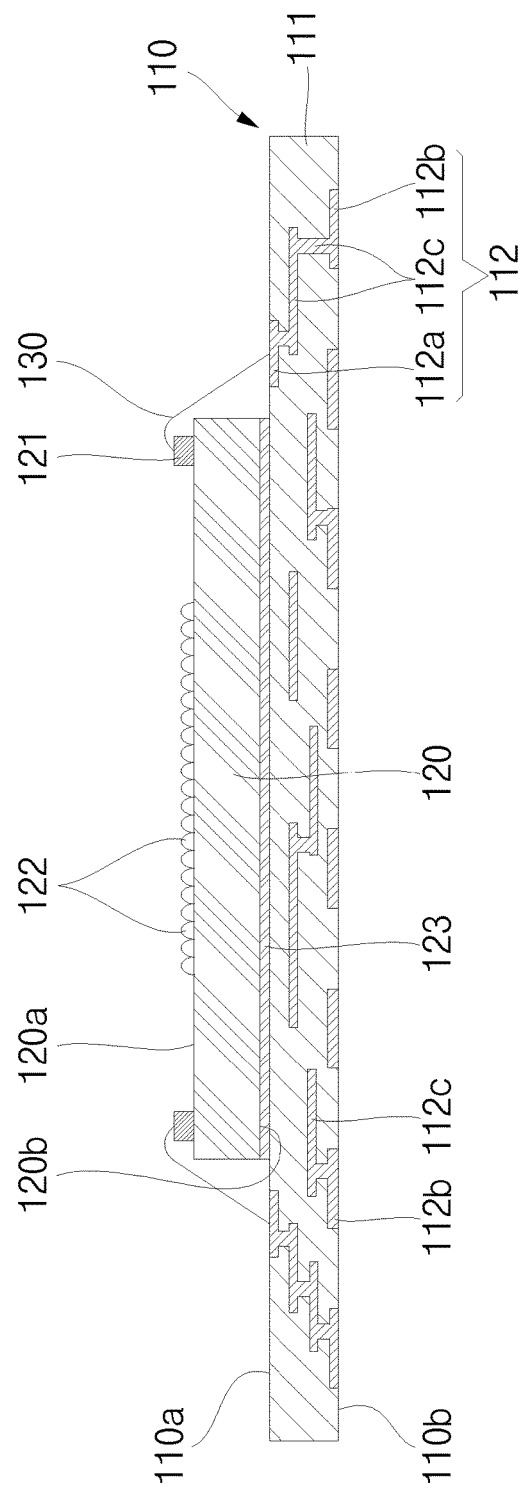

FIG. 2C shows a cross-sectional view of semiconductor device 100 at a later stage of manufacture. In the example shown in FIG. 2C, electronic device 120 can comprise one or more component terminals 121, and internal interconnects 130 can be provided and can couple component terminals 121 of electronic component 120 with conductive structure 112, for example substrate top terminals 112a of substrate 110. In some examples, internal interconnects 130 can comprise or be referred to as conductive wires or bonding wires. In some examples, internal interconnects 130 can comprise gold, aluminum, or copper. In some examples, internal interconnects 130 can be bonded to component terminals 121 in forms of wires using wire bonding equipment and can be bonded to substrate top terminals 112a to electrically connect substrate 110 with electronic component 120. After providing internal interconnects 130, a cleaning process can be performed to remove conductive materials remaining on substrate 110 and electronic component 120. In some examples, internal interconnects 130 can have a thickness in the range from approximately 15 $\mu m$ to approximately 30 $\mu m$.

Figure 2D:
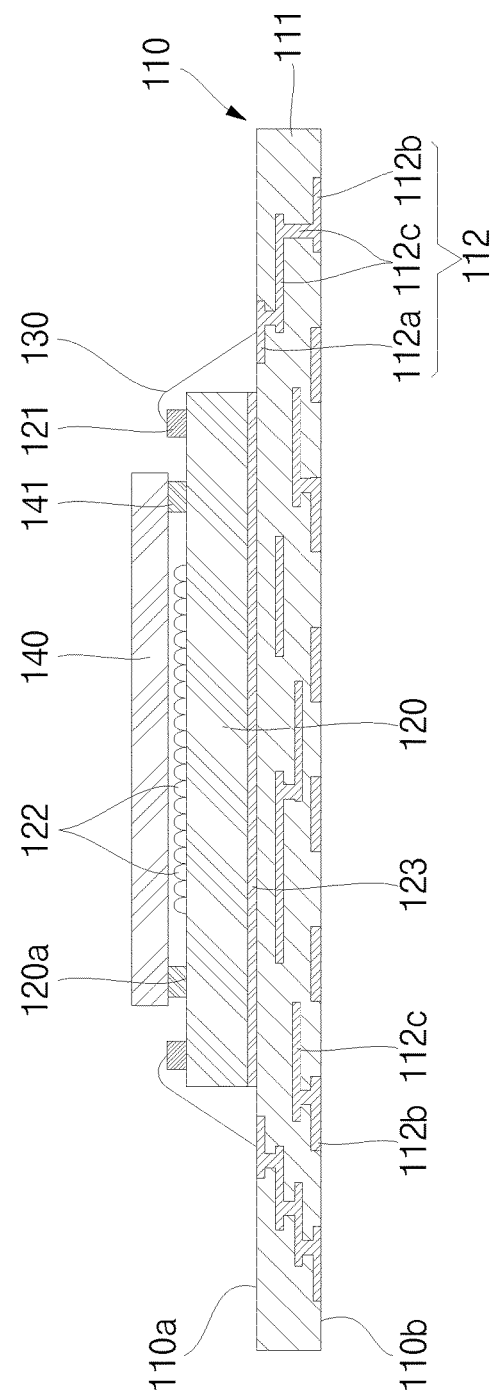

FIG. 2D shows a cross-sectional view of semiconductor device 100 at a later stage of manufacture. In the example shown in FIG. 2D, lid 140 can be provided over one or more interface elements 122 and top side 120a of electronic component 120. Lid seal 141 can be provided on top side 120a of electronic component 120, and lid 140 can be placed on lid seal 141. Lid 140 can be a planar plate. In some examples, pick-and-place equipment can pick up lid 140 to place it on top side 120a of electronic component 120 having lid seal 141 to attach lid 140 to electronic component 120. In some examples, lid 140 can protect interface elements 122 of electronic component 120. Interface elements 122 can pass through lid 140 to sense a physical, chemical, or biological change. In some examples, lid 140 can comprise or be referred to as a cover or a sensor protector. In some examples, lid 140 can comprise a translucent material, whether transparent or semi-transparent with respect to light or other radiation, a permeable material, or a transmissive material such as, for example, glass. Lid 140 can have a height in the range from approximately 3 millimeters (mm) to approximately 10 mm and a thickness in the range from approximately 0.1 mm to approximately 3 mm.

In some examples, lid seal 141 can be located laterally displaced from component terminals 121, or at one or more sections of a periphery of interface elements 122, on top side 120a of electronic component 120. In some examples, lid seal 141 can define one or more portions of a ring partially covering top side 120a of electronic component 120. In some examples, lid seal 141 can maintain or define a gap comprising air or a void between lid 140 and interface elements 122 or electronic component 120. In some examples lid seal 141 can be translucent or can extend to cover interface elements 122 such that the gap would be filled by lid seal 141. Lid seal 141 can have a greater thickness than interface elements 122. Lid seal 141 can have a thickness in the range from approximately 10 μm to approximately 800 μm. Lid seal 141 can comprise an adhesive component and can comprise or be referred to as an adhesive, an adhesive film, or an adhesive tape.

Figure 2E:
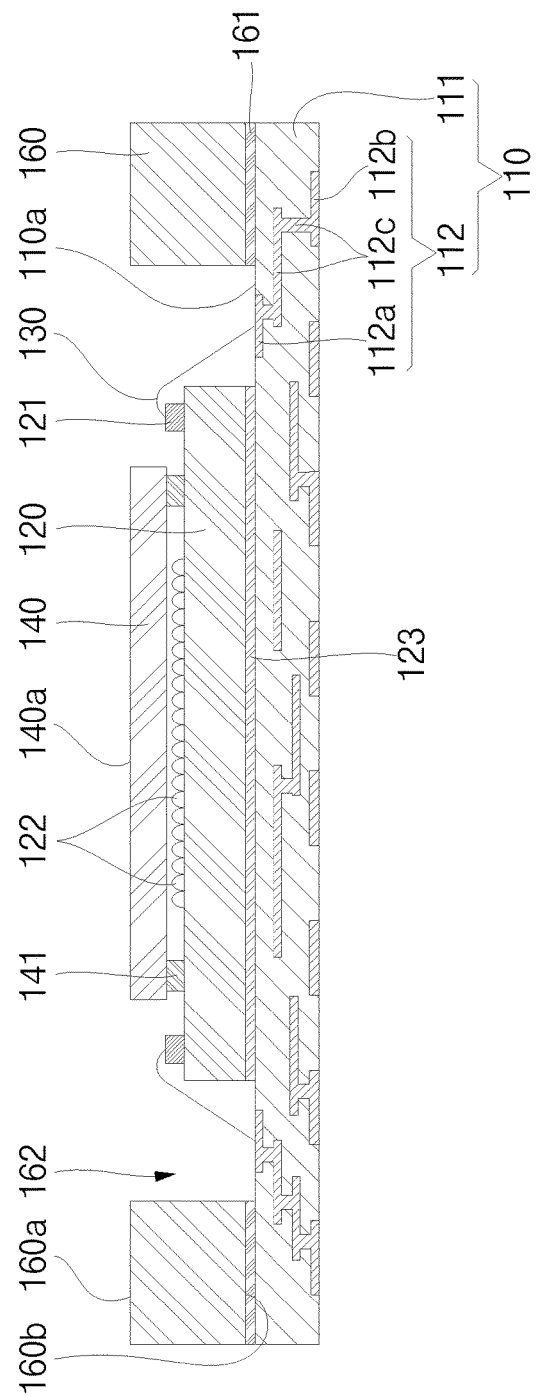

FIG. 2E shows a cross-sectional view of semiconductor device 100 at a later stage of manufacture. In the example shown in FIG. 2E, a bottom side 160b of body 160 can be provided over the top side 110a of substrate 110 and can be attached to top side 110a of substrate 110 using body adhesive 161. Body 160 can comprise or define cavity 162 passing through between top side 160a and bottom side 160b at the center of body 160. In some examples, pick-and-place equipment can pick up body 160 to place it on a side of body adhesive 161 located on top side 110a of substrate 110 to attach body 160 to substrate 110. Body 160 can be attached to top side 110a of substrate 110 to allow electronic component 120, internal interconnects 130, and lid 140 to be positioned in cavity 162. Body 160 can be a rectangular ring along the periphery of top side 110a of substrate 110. In some examples, a height of top side 160a of body 160 can be less than or equal to a height of top side 140a of lid 140. In some examples, body 160 can be spaced approximately 0.3 mm to approximately 3 mm apart from the periphery of lid 140.

In some examples, body 160 can comprise or be referred to as a molding part, a protection part, or a frame. Body 160 can be pre-formed prior to attachment to substrate 110 rather than being formed on substrate 110. In some examples, body 160 can comprise a mold compound, a metal, a laminate cavity substrate, or a rigid material. Body 160 can keep buffer 150 (FIG. 2F) located only in cavity 162 to prevent buffer 150 from flowing out. Top side 160a of body 160 can be substantially planar so that the top side of semiconductor device 100 can be substantially planar. Body 160 can protect internal interconnects 130 and lid 140 from external elements or environmental exposure. Body 160 can have a thickness in the range from approximately 0.2 mm to approximately 1 mm. Body adhesive 161 can be similar to, or can be similarly formed as, component adhesive 123.

Figure 2F:
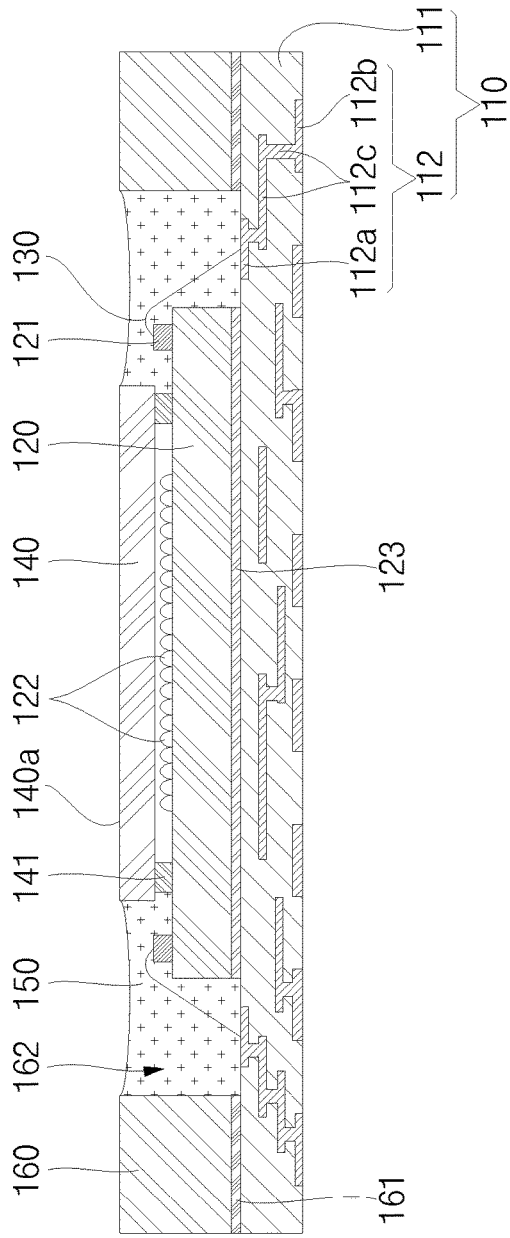

FIG. 2F shows a cross-sectional view of semiconductor device 100 at a later stage of manufacture. In the example shown in FIG. 2F, buffer 150 can be provided in cavity 162 so as to be over, cover, or contact top side 110a of substrate 110, lateral sides 120c or 120d of electronic component 120, and lateral sides 140c or 140d of lid 140. Buffer 150 can be applied, for example, by injection as a liquid or as a paste. Buffer 150 can substantially fill cavity 162 while exposing top side 140a of lid 140. In some examples, buffer 150 can comprise or be referred to as a sealing part, an encapsulation part, or a protection part.

In some examples, buffer 150 can comprise or be referred to as a stress-absorbent material, a stress-relief material, or a stress buffer material. Body 160 can be more rigid, stiffer, or harder than buffer 150, and buffer 150 can be configured to interpose between lid 140 and body 160. Buffer 150 can decrease or diffuse pressure or stresses from body 160, for example impact stresses or material expansion or contraction stresses, that otherwise could cause damage, bending, breakage, or fracturing of lid 140. In some examples, buffer 150 can comprise a resin, an epoxy, a gel, a silicone, an adhesive, or a supple, soft, pliable, or low-rigidity material. Buffer 150 can be a material other than mold compound or can be filler-free or otherwise devoid of filler particles such as inorganics like silica. In some examples, buffer 150 can comprise a material with an elastic modulus less than the elastic modulus of body 160. In some examples, buffer 150 can have or comprise a Coefficient of Thermal Expansion (CTE) less than the CTE of body 160. In some examples, the top side of buffer 150 can extend from the side of body 160, adjacent top side 160a, to the side lid 140, or adjacent top side 140a. In some examples, a majority of the top side of buffer 150 can be arcuate or concave between body 160 and lid 140. In some examples, internal interconnect 130 can be in buffer 150. Buffer 150 can have a thickness similar to body 160. Buffer 150 can be provided to cover substrate 110, electronic component 120, and internal interconnects 130 to protect substrate 110, electronic component 120, and internal interconnects 130 from external elements or environmental exposure.

Figure 2G:
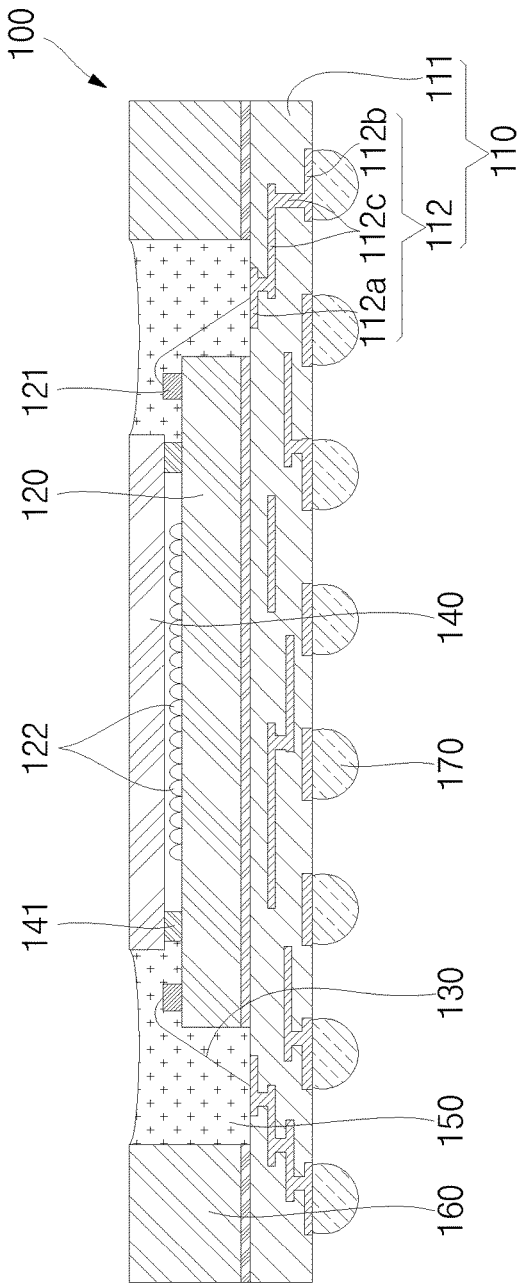

FIG. 2G shows a cross-sectional view of semiconductor device 100 at a later stage of manufacture. In the example shown in FIG. 2G, external interconnects 170 can be provided at substrate bottom terminals 112b of substrate 110. External interconnects 170 can be electrically connected to the bottom sides of substrate bottom terminals 112b. External interconnects 170 can be electrically connected to electronic component 120 through substrate 110 and internal interconnects 130.

External interconnects 170 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 170 can be provided by preparing a conductive material containing a solder on the bottom sides of substrate bottom terminals 112b of substrate 110 using a ball drop process, followed by performing a reflow process. Here, substrate bottom terminals 112b can be positioned to face upward. External interconnects 170 can comprise or be referred to as conductive balls such as solder balls, conductive pillars such as copper pillars, or conductive posts having solder caps positioned on copper pillars. External interconnects 170 can have a height in the range from approximately 0.2 mm to approximately 0.7 mm. In some examples, external interconnects 170 can comprise or be referred to as external input/output terminals of semiconductor device 100.

Figure 3:
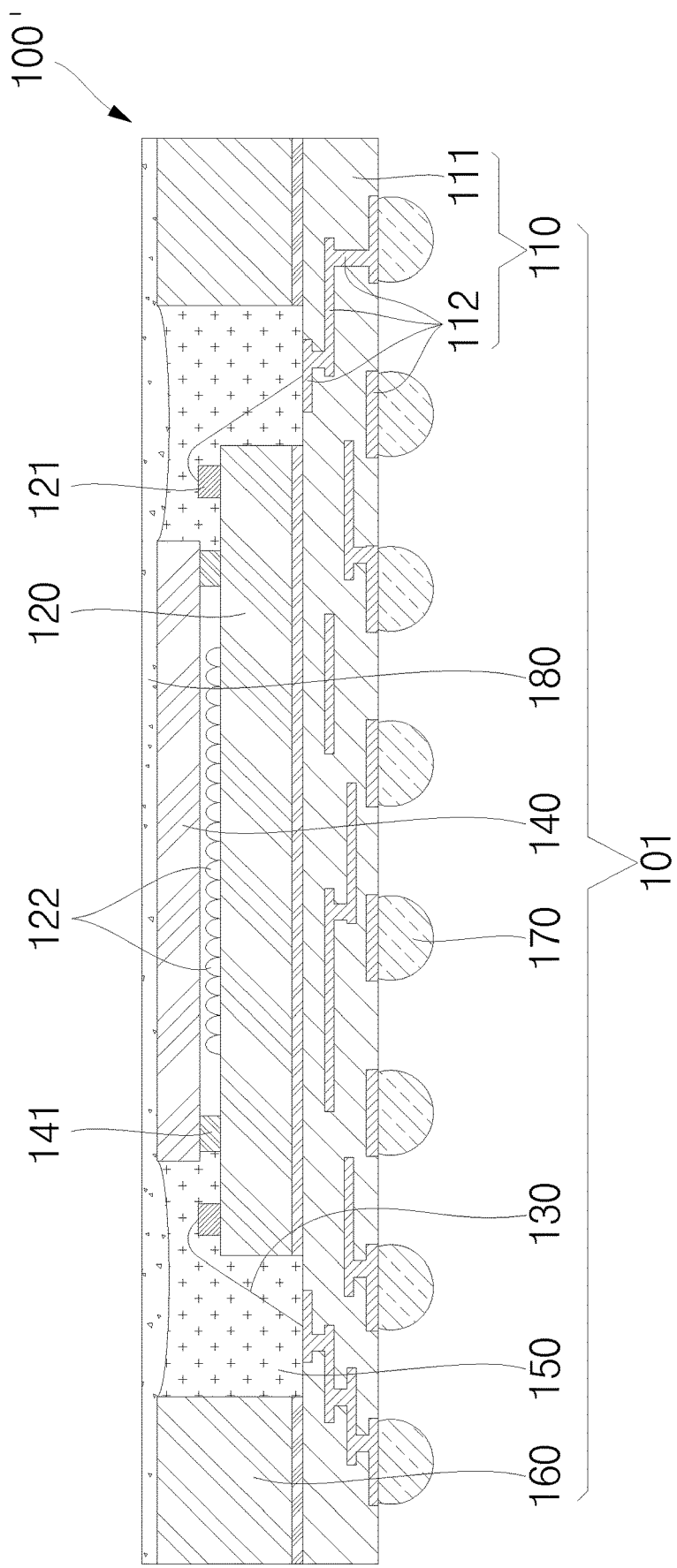
FIG. 3 shows a cross-sectional view of an example semiconductor device.

FIG. 3 shows a cross-sectional view of an example semiconductor device 100'. In the example shown in FIG. 3, semiconductor device 100' can comprise substrate 110, electronic component 120, internal interconnects 130, lid 140, body 160, buffer 150, external interconnects 170, and protection film 180.

Example semiconductor device 100' can be similar to example semiconductor device 100 shown in FIG. 1. For example, the manufacturing process and configuration of semiconductor device 100' can be similar to those of semiconductor device 100 shown in FIG. 1 and FIGS. 2A to 2G. Optionally, example semiconductor device 100' can comprise protection film 180.

Protection film 180 can be attached to cover top side of lid 140, top side 160a of body 160, and the top side of buffer 150. In some examples, optional protection film 180 can be over lid 140, buffer 150, or body 160. Protection film 180 can protect lid 140 from external elements or environmental exposure. In some examples, protection film 180 can comprise or be referred to as a protection layer, or a protection tape. In some examples, protection film 180 can be translucent. In some examples, protection film 180 can be directly attached to lid 140. In some examples, protection film 180 can be applied before or after attachment of electrodes 170. In some examples, protection film 180 can be a film or a tape comprising polyimide (PI), polyethylene (PE), polyester (PET), or thermoplastic polyurethane (TPU). Protection film 180 can have a thickness in the range from approximately 30 μm to approximately 100 μm.

Figure 4A:
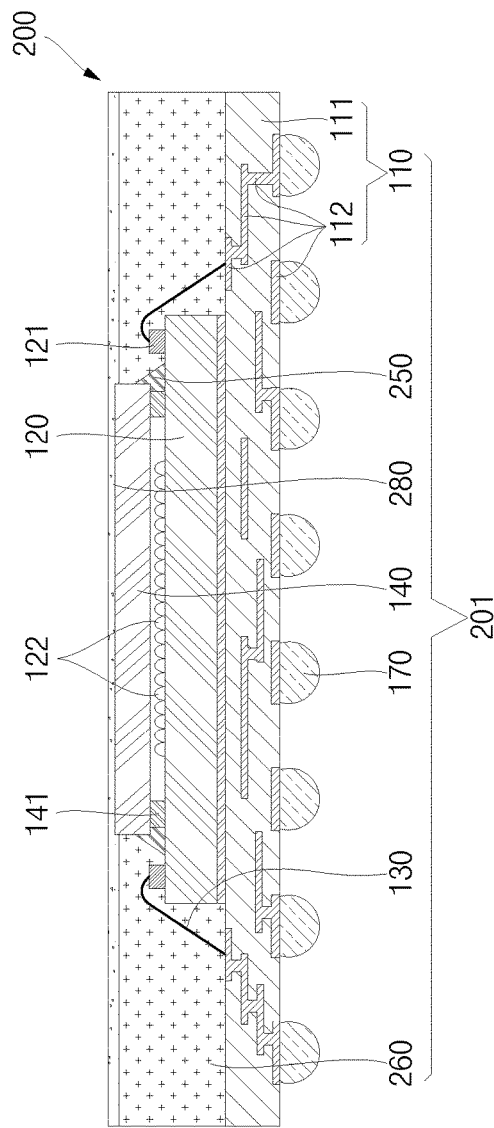
FIG. 4A to 4B shows cross-sectional views of example semiconductor devices.

FIG. 4A shows a cross-sectional view of an example semiconductor device 200. Semiconductor device 200 can be similar to semiconductor device 100 shown in FIG. 1 in view of substrate 110, electronic component 120, internal interconnects 130, lid 140, lid seal 141, or external interconnects 170. Semiconductor device 200 can comprise buffer 250, body 260, or protection film 280 that can be respectively similar in several respects to buffer 150, body 260, or protection film 180. Substrate 110, internal interconnects 130, lid 140, buffer 250, body 260, external interconnects 170, and protection film 280 can comprise or be referred to as semiconductor package 201 or package 201. In the example of FIG. 4A, buffer 250 covers a periphery of the lateral side 140c or 140d of lid 140 and a portion of top side 120a of electronic component 120 but leaves internal interconnects 130 and the lateral side 120c or 120d of electronic component 120 exposed. In some examples, component terminal 121 or internal interconnect 130 can be in body 260. In some examples, buffer 250 can contact seal 141 and body 260. In some examples, buffer 250 and seal 141 can each comprise a different material or can comprise the same material. In some examples, a portion of body 260 can be between buffer 250 and protection film 280.

Figure 4B:
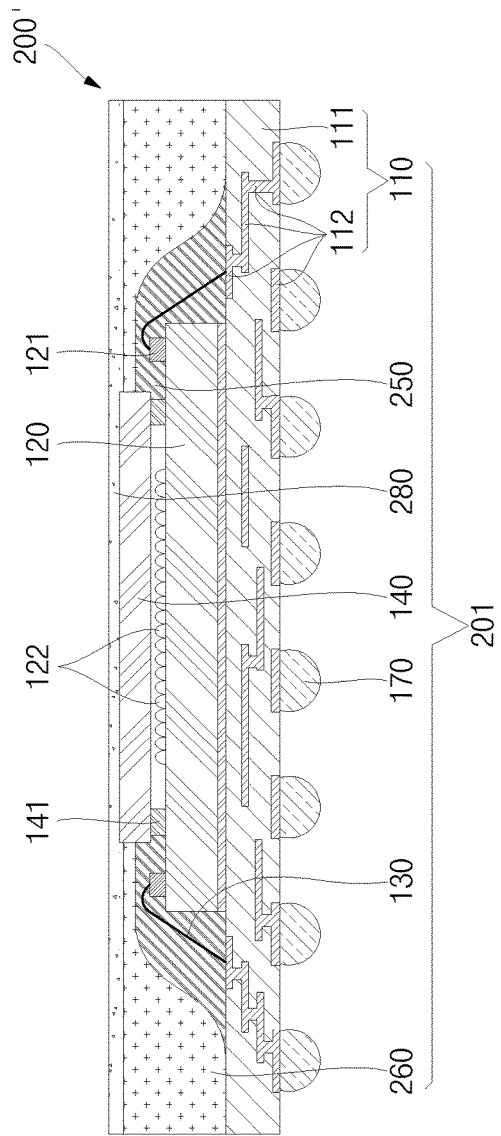

FIG. 4B shows a cross-sectional view of an example semiconductor device 200' that can be similar to semiconductor device 200 of FIG. 4A in terms of structure or method of manufacture. In the example of FIG. 4B, buffer 250 covers a periphery of the lateral side 140c or 140d of lid 140 and a portion of top side 120a of electronic component 120, and also covers portions of internal interconnects 130, lateral side 120c or 120d of electronic component 120, and top side 110a of substrate 110. In some examples, component terminal 121 or internal interconnect 130 can be in buffer 250. In some examples, buffer 250 can contact seal 141 and body 260. In some examples, buffer 250 and seal 141 can each comprise a different material or can comprise the same material. In some examples, a portion of body 260 can be between buffer 250 and protection film 280.

FIGS. 5A to 5E show cross-sectional views of an example method for manufacturing example semiconductor device 200. FIGS. 6A to 6B shows a plan view of an example method for manufacturing example semiconductor device 200 shown in FIG. 5B.

Figure 5A:
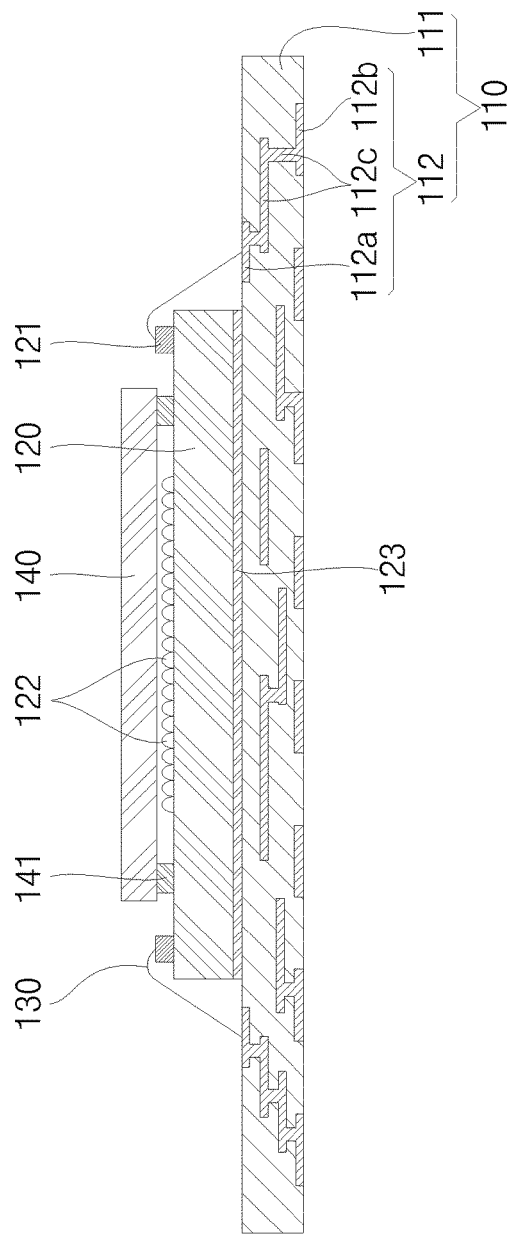
FIGS. 5A to 5E show cross-sectional views of an example method for manufacturing an example semiconductor device.
Figure 6A:
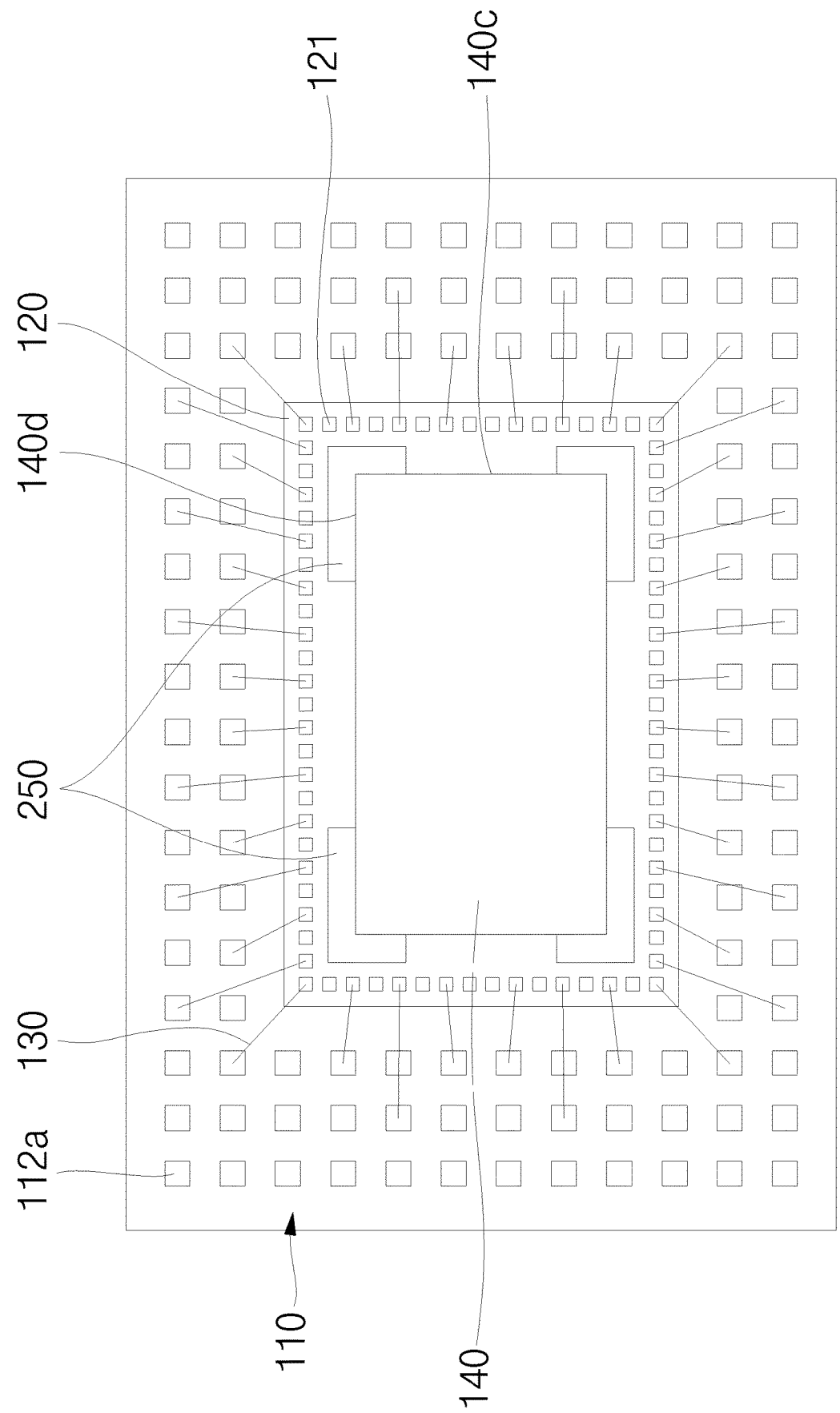
FIG. 6A to 6B shows a plan view of an example method for manufacturing an example semiconductor device shown in FIG. 5B.
Figure 6B:
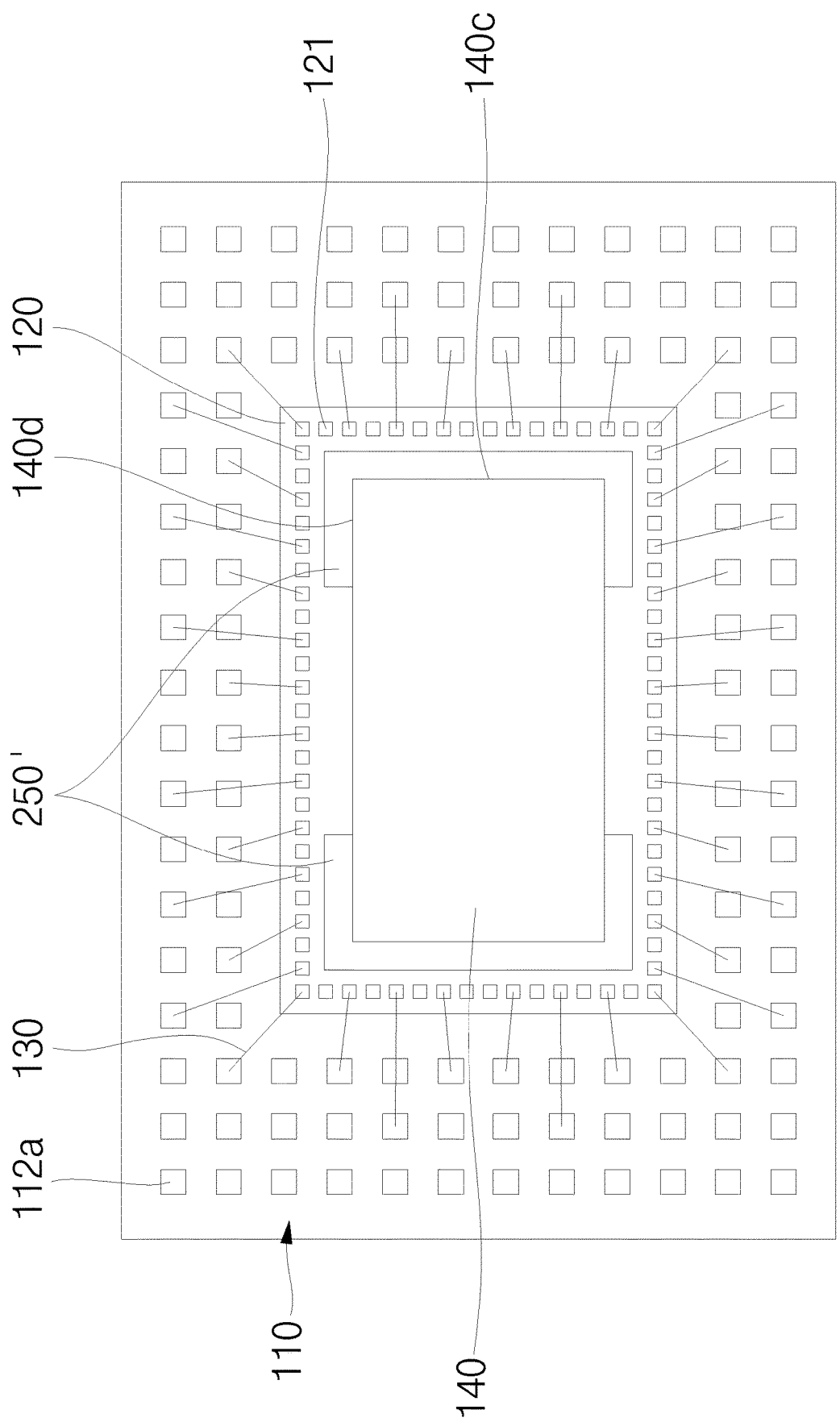

FIG. 5A shows semiconductor device 200 at an early stage of manufacture. The stage shown in FIG. 5A can correspond or be similar to the description of the example method previously described with respect to FIGS. 2A to 2D.

Figure 5B:
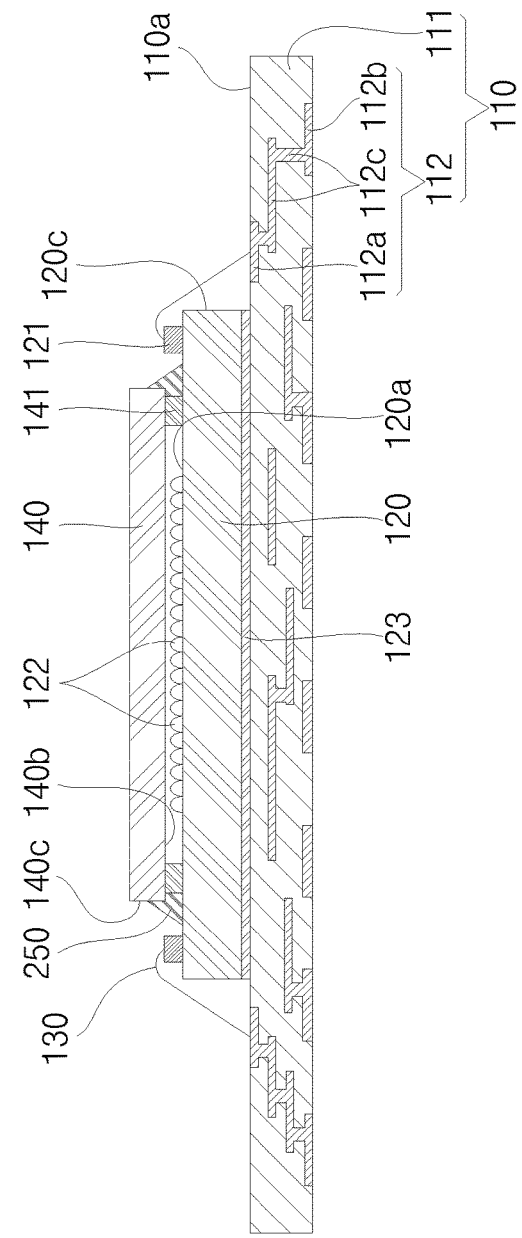

FIGS. 5B and 6A show semiconductor device 200 at a later stage of manufacture. In the example shown in FIGS. 5B and 6A, buffer 250 can be provided on corner regions of lid 140, extending between lateral sides 140c or 140d or bottom side 140b of lid 140 and top side 120a of electronic component 120. In some examples, buffer 250 can cover a majority of a height of lateral sides 140c or 140d of lid 140. In some examples, buffer 250 can fully cover the height of lateral sides 140c or 140d of lid 140. Buffer 250 covers a periphery portion of bottom side 140b of lid 140 in the present example but there can be examples where buffer 250 does not cover bottom side 140b of lid 140. Buffer 250 can extend to contact top side 120a of electronic component 120 adjacent the periphery of lid 140. Buffer 250 can extend adjacent lid seal 141 on top side 120a of electronic component 120. Buffer 250 can be positioned between corner regions of lid 140 and top side 120a of electronic component 120. In some examples, buffer 250 can support lid 140 from bottom side 140b or lateral sides 140c or 140d of lid 140. In some examples, such as with respect to FIG. 4B, buffer 250 can further extend to contact internal interconnects 130, lateral sides 120c or 120d of electronic component 120, or top side 110a of substrate 110. Buffer 250 can be provided to cover portions of a periphery of lid 140 to prevent damage or stress from physical elements, such as from body 260 or from other external elements. In some examples, component terminal 121 and internal interconnect 130 can be in body 260. In some examples, buffer 250 can contact seal 141 and body 260. In some examples, buffer 250 and seal 141 can each comprise a different material or can comprise the same material.

Buffer 250 can expose or be discontinuous about a central area defined between lateral sides 140c and lateral sides 140d of lid 140. As shown in FIG. 6A, buffer 250 can protect regions around angular points, edges, or corners of lid 140 that can be vulnerable to stress, fracture, or damage from, for example, what would otherwise be a rigid interface with body 260. In some examples, buffer 250 can contact one or more corners of lid 140. As shown in FIG. 6B, buffer 250' can protect the entire edge of lateral sides 140c or 140d of lid 140. In some examples, buffer 250' can contact one or more lateral sides of lid 140. In some examples, buffer 250' can also protect the entire edge or lateral sides 140d of lid 140.

In some examples, buffer 250 can be similar to buffer 150 described with respect to FIGS. 1-3. For instance, buffer 250 can comprise a material or composition similar to that of buffer 150 or can be provided or dispensed in similar fashion. In some examples, buffer 250 can comprise or be referred to a shock absorbing structure, a shock absorbing layer, a buffering structure, or a buffering layer. In some examples, buffer 250 can be made of non-conductive epoxy or silicon and can be cured by heat or light such as ultraviolet (UV) light. Buffer 250 can have a thickness in the range from approximately 10 μm to approximately 300 μm.

Figure 5C:
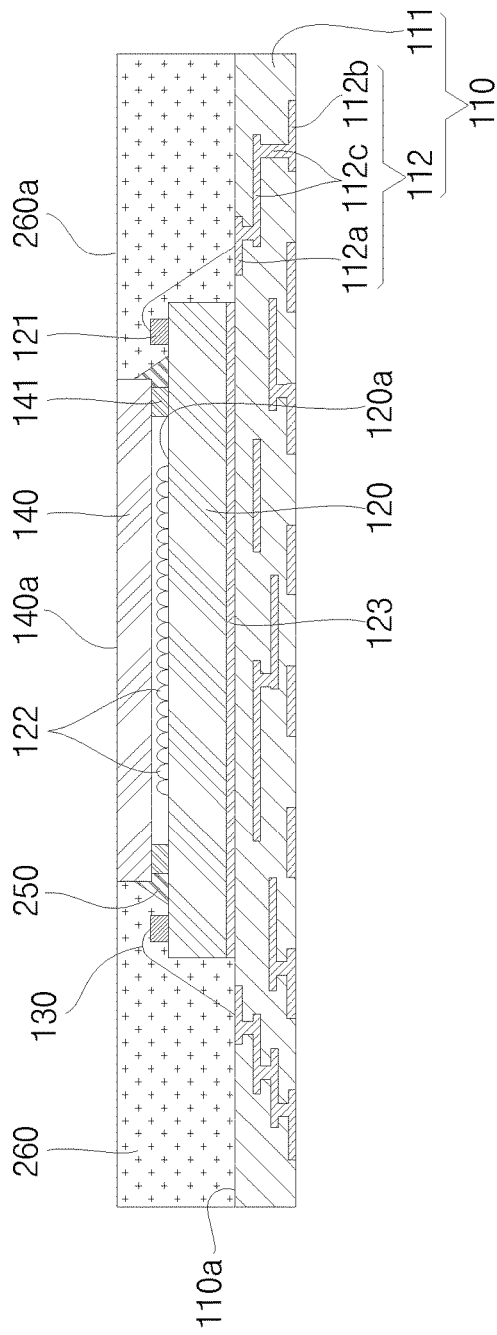

FIG. 5C shows semiconductor device 200 at a later stage of manufacture. In the example shown in FIG. 5C, body 260 can cover or surround substrate 110, electronic component 120, internal interconnects 130, lid 140, or buffer 250. Body 260 can expose top side 140a of lid 140. In some examples, top side 260a of body 260 can be substantially coplanar with top side 140a of lid 140. In some examples, top side 140a of lid 140 can slightly protrude above top side 260a of body 260. Body 260 can be similar to body 160 described with respect to FIGS. 1-3, such as in terms of material or composition. In some examples, body 260 can be formed on substrate 110, electronic component 120, or buffer 250, rather than being pre-formed and then attached to substrate 110. In some examples, body 260 can be provided by a film-assisted molding process, a compression molding process, a transfer molding process, a vacuum lamination process, or a paste printing process.

Figure 5D:
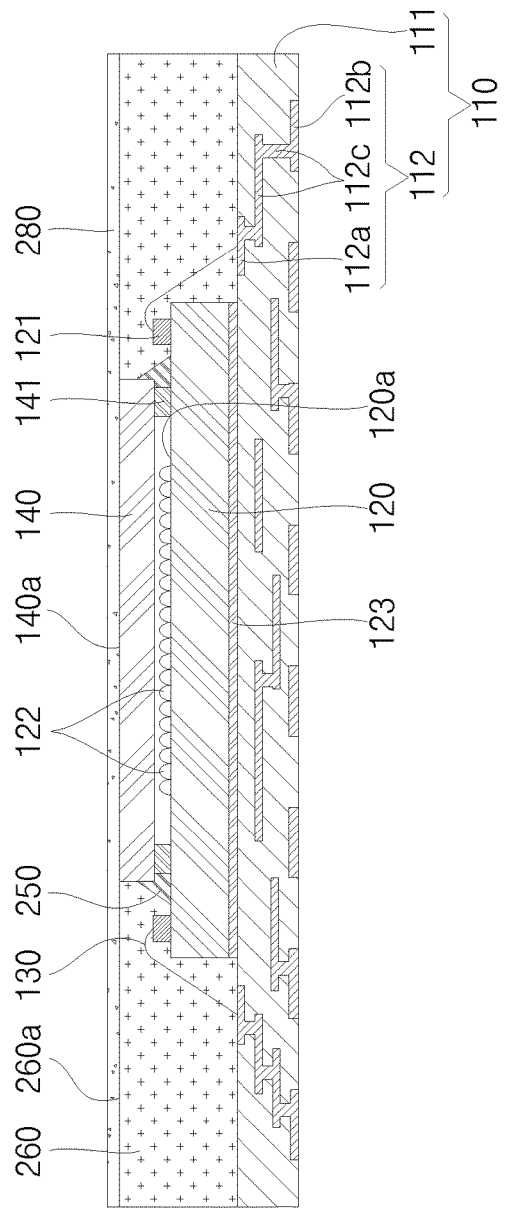

FIG. 5D shows semiconductor device 200 at a later stage of manufacture. In the example shown in FIG. 5D, protection film 280 can be attached to top side 140a of lid 140 and top side 260a of body 260. Protection film 280 can be similar to, and can be similarly formed as, protection film 180. Protection film 280 can be an optional element of semiconductor device 200.

Figure 5E:
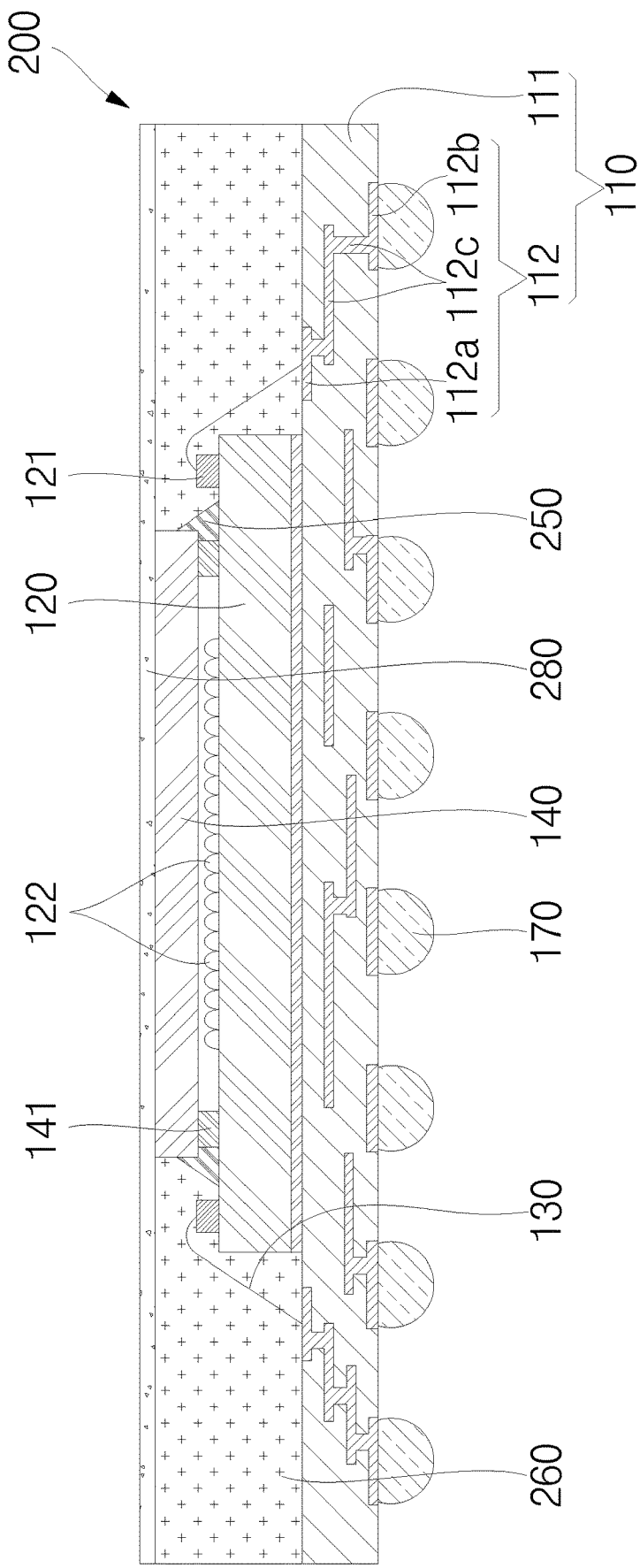

FIG. 5E shows semiconductor device 200 at a later stage of manufacture. In the example shown in FIG. 5E, external interconnects 170 can be electrically connected to the bottom sides of substrate bottom terminals 112b.

Figure 7:
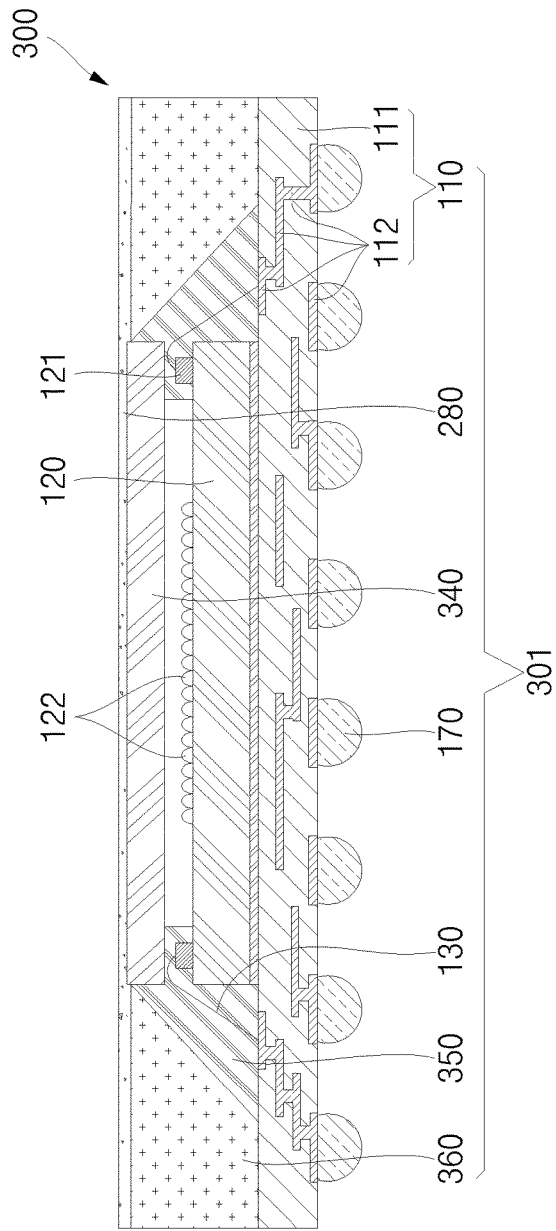
FIG. 7 shows a cross-sectional view of an example semiconductor device.

FIG. 7 shows a cross-sectional view of example semiconductor device 300. Semiconductor device 300 can be similar to semiconductor device 100 shown in FIGS. 1-3, or to semiconductor devices 200 or 200' shown in FIGS. 4-6. Semiconductor device 300 can comprise substrate 110, electronic component 120, internal interconnects 130, and external interconnects 170. Substrate 110 can comprise a top side 110a, a bottom side 110b, and conductive structure 112. Electronic component 120 can be over the top side 110a of substrate 110. Electronic component 120 can comprise a component terminal 121 and on or more interface elements 122 on the top side 120a of electronic component 120. Semiconductor device 300 also can comprise lid 340, buffer 350, or body 360 that can be respectively similar in several aspects to lid 140, buffer 150 or buffer 250, or body 160 or body 260. Substrate 110, internal interconnects 130, lid 340, buffer 350, body 360, external interconnects 170, and protection film 280 can comprise or be referred to as semiconductor package 301 or package 301. Internal interconnect 130 can be electrically coupled to component terminal 121 and conductive structure 112. Lid 340 can be over the one or more interface elements 120. Body 360 can be over substrate 110. In some examples, component terminal 121 and internal interconnect 130 can be in buffer 350. In some examples, buffer 350 can function as a seal between lid 340 electronic component 120 and can be between lid 340 and body 360 or between electronic component 120 and body 360. In some examples, the buffer 350 and the seal can comprise the same structure wherein buffer 350 functions as the seal. In some examples, buffer 350 can contact protection film 280.

Figure 8A:
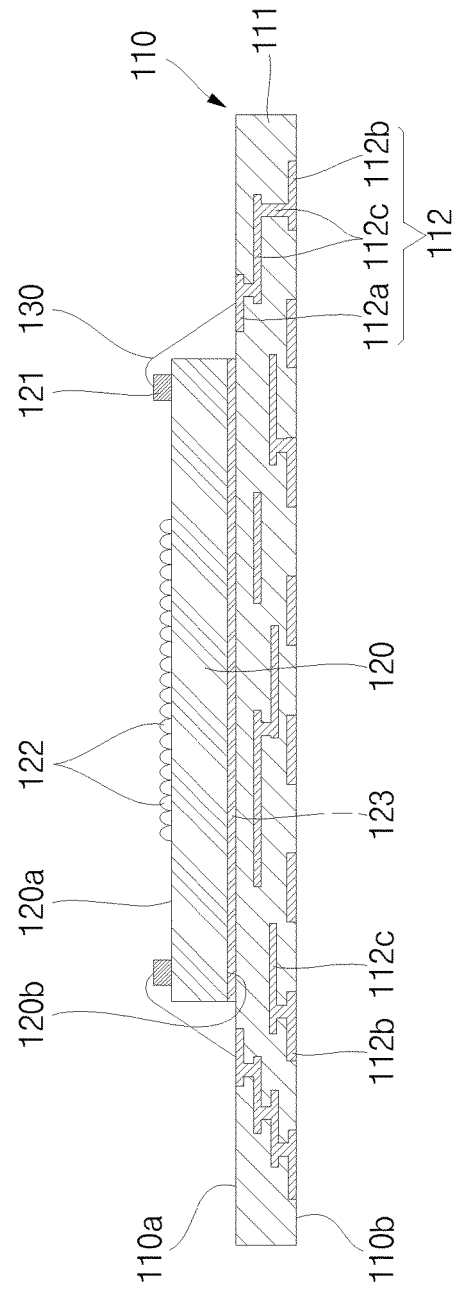
FIGS. 8A to 8F show cross-sectional views of an example method for manufacturing an example semiconductor device.

FIGS. 8A to 8F show cross-sectional views of an example method for manufacturing example semiconductor device 300. FIG. 8A shows semiconductor device 300 at an early stage of manufacture. The stage shown in FIG. 8A can correspond or be similar to the description of the example method previously described with respect to FIGS. 2A to 2C.

Figure 8B:
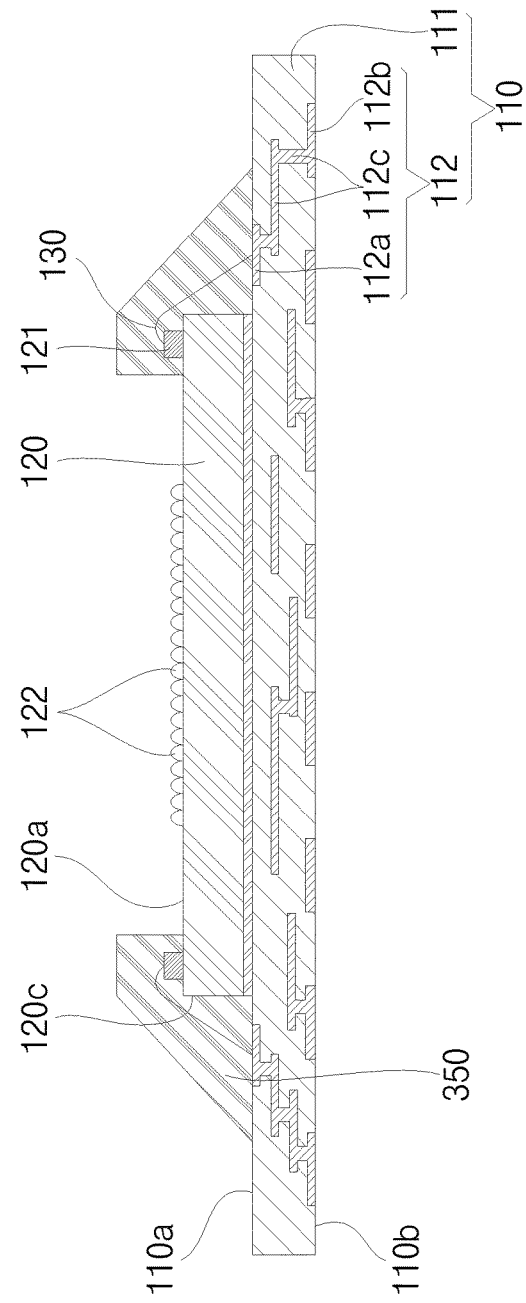

FIG. 8B shows semiconductor device 300 at a later stage of manufacture. In the example shown in FIG. 8B, buffer 350 can be provided to cover and protrude above internal interconnects 130. Buffer 350 can contact top side 120a and lateral sides 120c or 120d of electronic component 120, and top side 110a of substrate 110. Buffer 350 can cover the periphery of top side 120a of electronic component 120, and can cover lateral sides 120c or 120d of electronic component 120. Buffer 350 can also cover component terminals 121 of electronic component 120, and substrate top terminals 112a of substrate 110. Buffer 350 can also cover internal interconnects 130 to protect them from external elements or environmental exposure. Buffer 350 can be provided before lid 340 is provided and before body 360 is provided.

In some examples, buffer 350 can be similar to buffer 150 or 250 described with respect to FIGS. 1-6. For instance, buffer 350 can comprise a material or composition similar to that of buffer 150 or 250, or can be provided or dispensed in similar fashion. In some examples, buffer 350 can comprise or be referred to as shock absorbing structure, a shock absorbing layer, a buffering structure, or a buffering layer. Buffer 350 can have a thickness in the range from approximately 0.3 mm to approximately 1 mm.

Figure 8C:
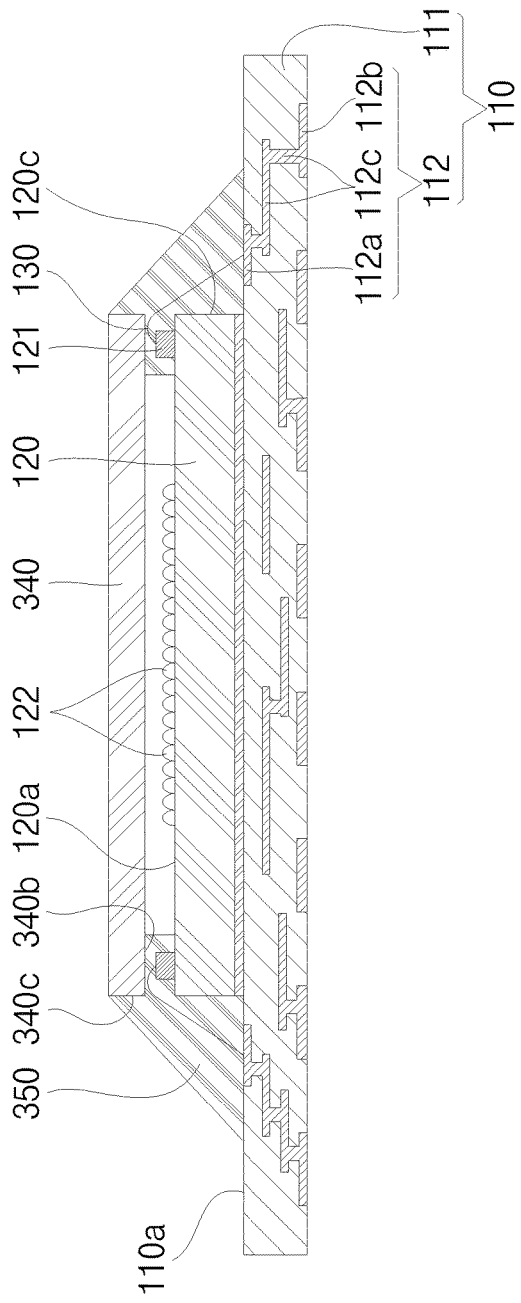

FIG. 8C shows semiconductor device 300 at a later stage of manufacture. In the example shown in FIG. 8C, lid 340 can be placed on buffer 350. Lid 340 can be similar to lid 140, and can extend to overlap over internal interconnects 130 or over component terminals 121 of electronic component 120. In some examples lid 340 can be pressed onto buffer 350, and buffer 350 can deform to contact edges of bottom side 340b or lateral sides 340c of lid 340. In some examples, buffer 350 can be similar to lid seal 141, can be translucent, or can further extend to also cover interface elements 122, such that the gap between lid 340 and electronic component 120 can be filled by buffer 350. Internal interconnect 130 can be coupled to component terminal 121 in a Film-Over-Wire (FOW) configuration, covered by buffer 350 and overlapped by lid 340 over component terminal 121. After lid 340 is placed on buffer 350, buffer 350 can be cured for structural integrity to stably keep supporting lid 340. In some examples, buffer 350 can be cured by heat or light such as UV-light. Lid 340 can be spaced apart from component terminals 121 or interface elements 122 of electronic component 120, or from internal interconnects 130, by buffer 350.

Figure 8D:
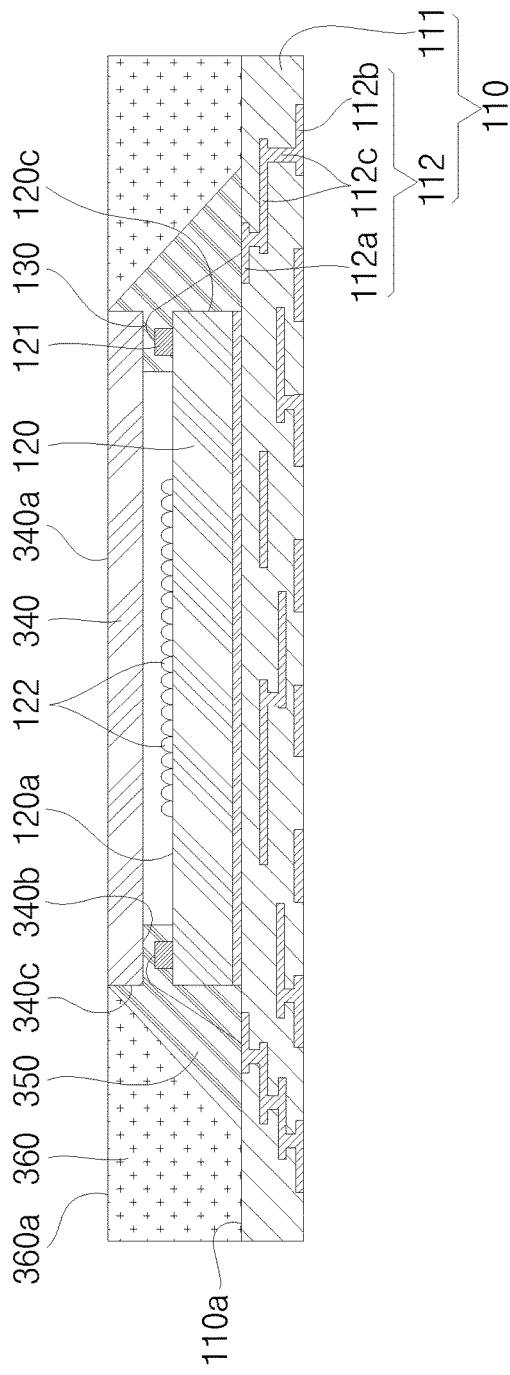

FIG. 8D shows semiconductor device 300 at a later stage of manufacture. In the example shown in FIG. 8D, body 360 can cover or surround substrate 110, electronic component 120, internal interconnects 130, lid 140, or buffer 350. Body 360 can expose top side 340a of lid 340. In some examples, top side 360a of body 360 can be substantially coplanar with top side 340a of lid 340. In some examples, top side 340a of lid 340 can slightly protrude above top side 360a of body 360. Body 360 can be similar to body 160 described with respect to FIGS. 1-3, or to body 260 described with respect to FIGS. 4-6 such as in terms of material or composition. In some examples, body 360 can be formed on substrate 110 or buffer 350, rather than being pre-formed and then attached to substrate 110. In some examples, body 360 can be provided by a film-assisted molding process, a compression molding process, a transfer molding process, a vacuum lamination process, or a paste printing process.

Figure 8E:
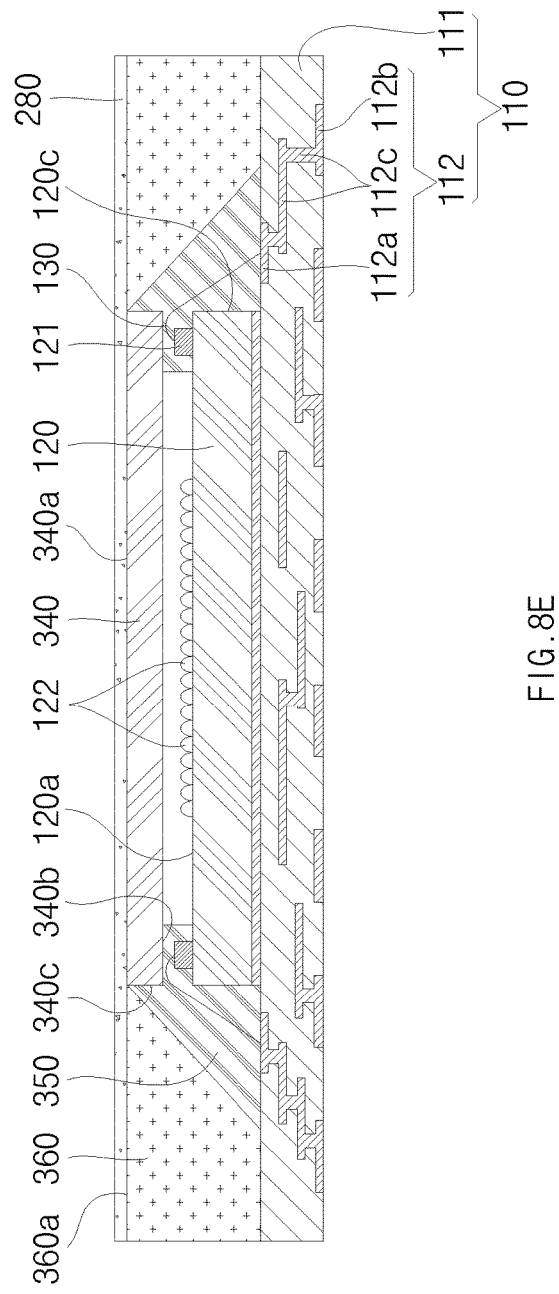

FIG. 8E shows semiconductor device 300 at a later stage of manufacture. In the example shown in FIG. 8E, protection film 280 can be attached to be over or to cover top side 140a of lid 140 and top side 360a of body 360.

Figure 8F:
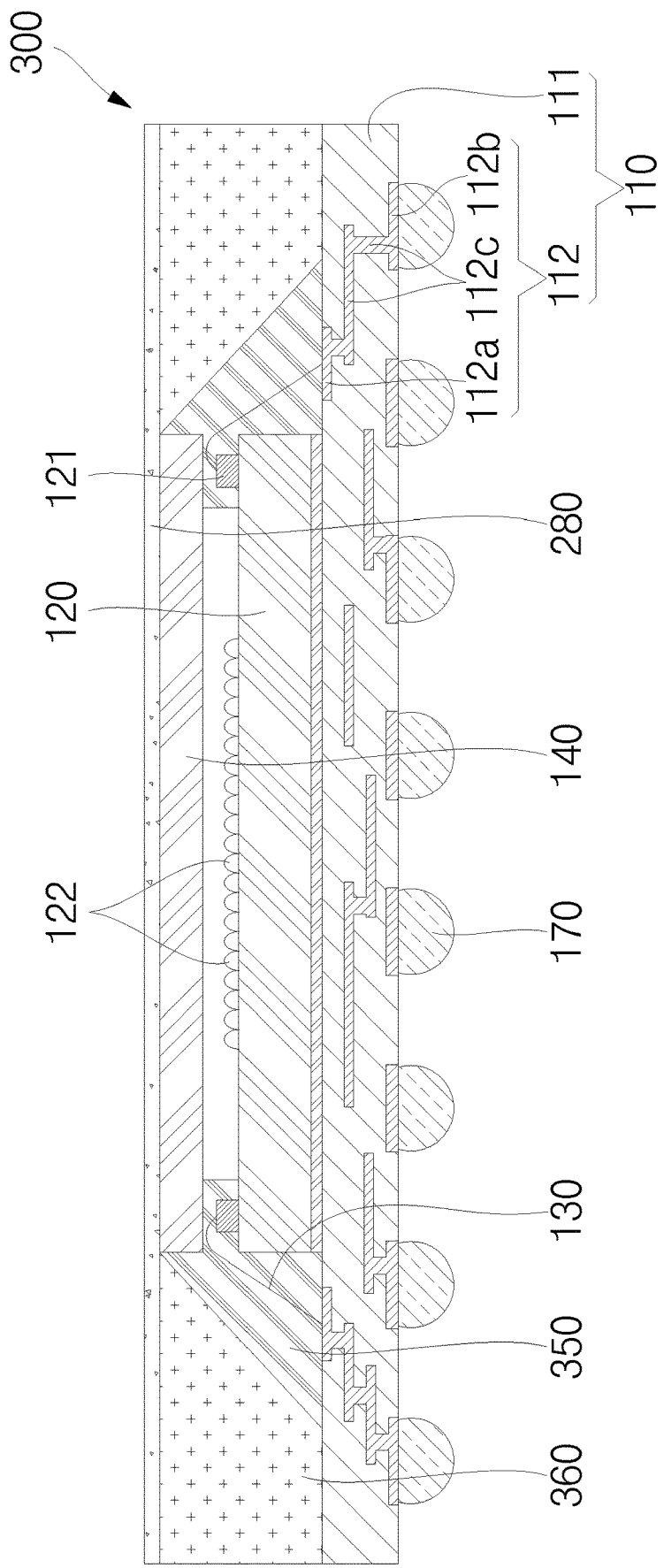

FIG. 8F shows semiconductor device 300 at a later stage of manufacture. In the example shown in FIG. 8F, external interconnects 170 can be electrically connected to the bottom sides of substrate bottom terminals 112b.

Figure 9:
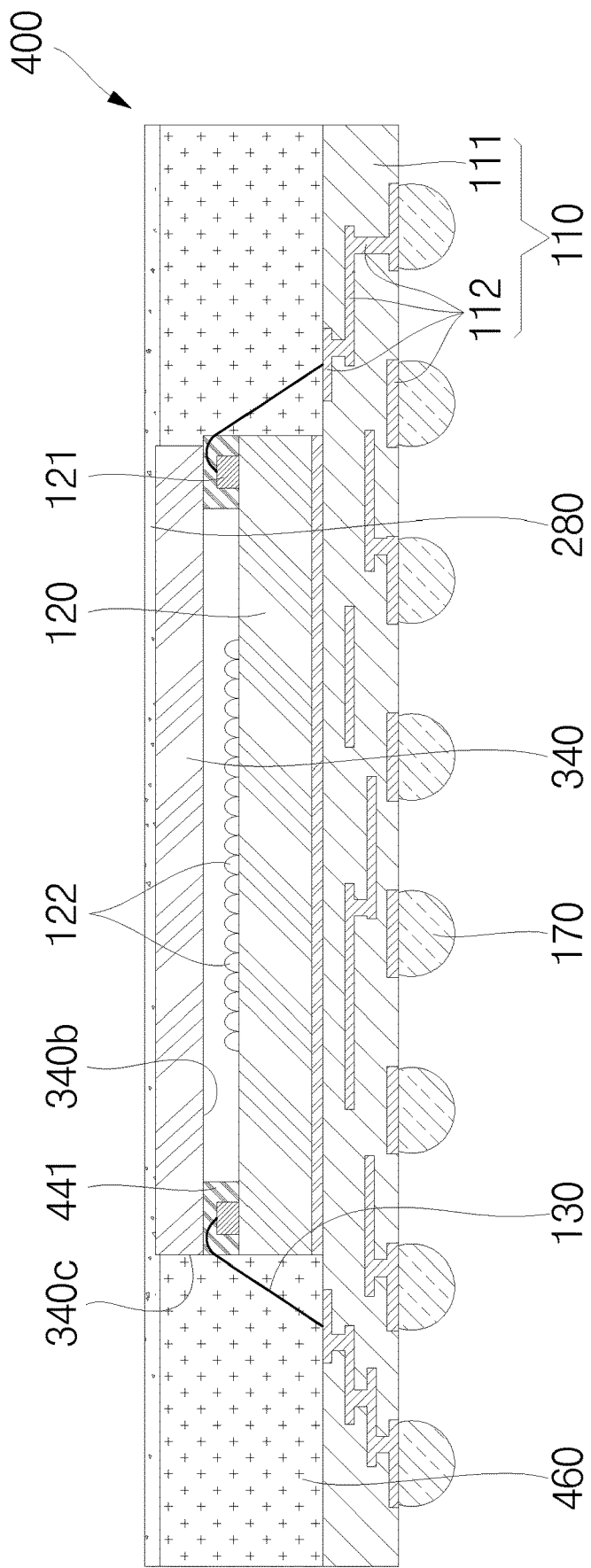
FIG. 9 shows a cross-sectional view of an example semiconductor device.

FIG. 9 shows a cross-sectional view of example semiconductor device 400. Semiconductor device 300 can be similar to semiconductor device 100 shown in FIGS. 1-3, to semiconductor devices 200 or 200' shown in FIGS. 4-6, or to semiconductor device 300 shown in FIGS. 7-8. Semiconductor device 400 can comprise substrate 110, electronic component 120, internal interconnects 130, external interconnects 170, lid 340, lid seal 441, or body 460. In some examples, lid seal 441 can be similar to lid seal 141 previously described, and is located between bottom side 340b of lid 340 and electronic component 120. There can also be examples where lid seal 441 can be similar to buffer 250 shown in FIGS. 4-5 extending to contact lateral side 340c of lid 340. Body 460 can be similar in terms of material or formation to body 160, body 260, or body 360 previously described. Body 460 is shown extending to contact a majority of lateral side 340c of lid 340, but in some examples, lid seal 441 can be interposed at least partially between body 460 and lateral side 340c of lid 340. Internal interconnect 130 is coupled to component terminal 121 in a Film-Over-Wire (FOW) configuration, covered by lid seal 141 between lid 340 and electronic component 120. Such an FOW configuration permits reduction of the width of semiconductor device 400 because space normally allocated for lid seal 441 can be consolidated with the space comprising component terminal 121. Internal interconnect 130 can be electrically coupled to component terminal 121 and conductive structure 112. Lid 340 can be over the one or more interface elements 120. Body 460 can be over substrate 110. In some examples, component terminal 121 and a portion of internal interconnect 130 can be in lid seal 441, and a portion of internal interconnect 130 can be in body 460. In some examples, body 460 can contact a lateral side 340c of lid 340. In some examples, lid seal 441 can be between lid 340 electronic component 120. In some examples, lid seal 441 can comprise the same material as a buffer material. In some examples, lid seal 441 can comprise a translucent material and can cover a substantial portion of the bottom side 340b of lid 340, and can comprise a single continuous material in some examples. The translucent material can cover one or more of the interface elements 122.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:
   a substrate comprising a top side, a bottom side, and a conductive structure, wherein the conductive structure comprises a horizontal trace between the top side and the bottom side of the substrate;
   a body over the top side of the substrate;
   an electronic component over the top side of the substrate and adjacent to the body, wherein the electronic component comprises an interface element on a top side of the electronic component;
   a lid over the interface element and a seal between the top side of the electronic component and the lid;
   a buffer on the top side of the substrate between the electronic component and the body; and
   a protection film over the lid, the buffer, and the body, wherein the protection film contacts the buffer;
   wherein:
      an internal interconnect is in the buffer;
      the internal interconnect is external to the body and the seal; and
      the seal does not contact the interface element.

2. The semiconductor device of claim 1, wherein the electronic component comprises a component terminal, and wherein the internal interconnect is electrically coupled with the component terminal and the conductive structure of the substrate.

3. The semiconductor device of claim 1, wherein the buffer contacts the seal and the body.

4. The semiconductor device of claim 1, wherein the buffer and the seal each comprise a different material.

5. The semiconductor device of claim 1, wherein the buffer and the seal each comprise a same, continuous material.

6. The semiconductor device of claim 1, wherein the seal comprises a translucent material that covers the interface element.

7. The semiconductor device of claim 1, wherein the buffer contacts the protection film.

8. The semiconductor device of claim 1, wherein the body is between the buffer and the protection film.

9. The semiconductor device of claim 1, wherein the buffer contacts a corner of the lid.

10. The semiconductor device of claim 1, wherein the buffer contacts a lateral side of the lid.

11. A method, comprising:
    providing a substrate comprising a top side, a bottom side, and a conductive structure;
    providing an electronic component over the top side of the substrate, wherein the electronic component comprises an interface element and a component terminal on the top side of the electronic component;
    providing an internal interconnect electrically coupling the interface element and the conductive structure;
    providing a lid over the interface element and seal between the top side of the electronic component and the lid; and
    providing a body over the top side of the substrate;
      wherein a buffer is provided before the lid is provided and before the body is provided, the seal is between the interface element and the buffer, and the interface element is free of the buffer.

12. The method of claim 11, wherein the buffer is provided over a top side of the electronic component and contacting a lateral side of the lid.

13. The method of claim 11, further comprising providing a protection film over the lid and over the body, wherein the protection film is over the body and contacts the buffer.

14. A semiconductor device, comprising:
    a substrate comprising a top side, a bottom side, and a conductive structure;
    an electronic component over the top side of the substrate, wherein the electronic component comprises an interface element and a component terminal on a top side of the electronic component;
    an internal interconnect electrically coupled to the component terminal and the conductive structure;
    a lid over the interface element;
    a seal between the top side of the electronic component and the lid; and
    a body over the top side of the substrate;
    wherein the body contacts a lateral side of the lid, the component terminal is in the seal, and the internal interconnect is in the body; and
    wherein the seal does not contact the interface element.

15. The semiconductor device of claim 14, wherein the seal comprises a buffer material contacting a lateral side of the lid and the component terminal is in the buffer material.

16. A semiconductor device, comprising:
a substrate comprising a top side, a bottom side, and a conductive structure;
a body over the top side of the substrate;
an electronic component over the top side of the substrate and adjacent to the body, wherein the electronic component comprises an interface element on a top side of the electronic component;
a lid over the interface element and a seal between the top side of the electronic component and the lid;
a buffer on the top side of the substrate between the electronic component and the body; and
a protection film over the lid, the buffer, and the body;
wherein the protection film is discrete from the body.

17. The semiconductor device of claim 16, wherein the buffer contacts the protection film.

18. The semiconductor device of claim 16, wherein the body is between the buffer and the protection film.

* * * * *